US010615244B2

United States Patent
Hou

(10) Patent No.: US 10,615,244 B2
(45) Date of Patent: Apr. 7, 2020

(54) OLED DISPLAY PANEL HAVING RESET SIGNAL LINES TO RESET PIXEL UNITS AND DISPLAY DEVICE WITH THE SAME

(71) Applicant: Wuhan China Star Optoelectronics Semiconductor Display Technology Co., Ltd., Wuhan, Hubei (CN)

(72) Inventor: Xueshun Hou, Guangdong (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/109,778

(22) Filed: Aug. 23, 2018

(65) Prior Publication Data

US 2019/0326381 A1   Oct. 24, 2019

Related U.S. Application Data

(63) Continuation of application No. PCT/CN2018/092072, filed on Jun. 21, 2018.

(30) Foreign Application Priority Data

Apr. 20, 2018   (CN) .......................... 2018 1 0359636

(51) Int. Cl.
*G09G 3/30*      (2006.01)
*H01L 27/32*     (2006.01)
*G09G 3/3258*    (2016.01)

(52) U.S. Cl.
CPC ....... *H01L 27/3276* (2013.01); *G09G 3/3258* (2013.01); *G09G 2300/0426* (2013.01); *G09G 2300/0842* (2013.01); *G09G 2320/0233* (2013.01); *G09G 2330/028* (2013.01)

(58) Field of Classification Search
CPC ............ G09G 3/12; G09G 3/30–3291; G09G 2300/0421–043
See application file for complete search history.

(56) References Cited

U.S. PATENT DOCUMENTS

| 9,478,567 | B1  | 10/2016 | Jin |  |
|---|---|---|---|---|
| 2010/0156875 | A1* | 6/2010 | Kim | ..................... G09G 3/3233 345/211 |
| 2013/0215092 | A1 | 8/2013 | Wu et al. | |

(Continued)

FOREIGN PATENT DOCUMENTS

| CN | 104217682 A | 12/2014 |
|---|---|---|
| CN | 106782329 A | 5/2017 |

(Continued)

*Primary Examiner* — Sanghyuk Park

(57) ABSTRACT

Embodiments of the present disclosure provide an OLED display panel and a display device, wherein the display panel includes an array substrate, a reset signal line and a power signal line. The reset signal line and the power signal line are respectively connected to pixel units of the array substrate. Therein, the power signal line is used to transmit a power voltage to the pixel units of array substrate such that the pixel units can operate, and the reset signal line is used to transmit reset voltage to the pixel units of the array substrate to reset the pixel units. The reset signal line includes a connection line connected to the pixel units of the array substrate, and a current direction in the power signal line is the same as that in the connection line.

17 Claims, 4 Drawing Sheets

(56) References Cited

U.S. PATENT DOCUMENTS

| | | | |
|---|---|---|---|
| 2016/0043010 A1* | 2/2016 | Kwak | H01L 22/14 |
| | | | 257/48 |
| 2016/0203761 A1 | 7/2016 | Zhang | |
| 2017/0077143 A1* | 3/2017 | Lee | G09G 3/3648 |
| 2017/0249898 A1 | 8/2017 | Ma | |
| 2017/0288008 A1* | 10/2017 | Kim | H01L 27/3279 |
| 2018/0032189 A1* | 2/2018 | Lee | G06F 3/0412 |
| 2018/0090061 A1* | 3/2018 | Kim | G09G 3/3233 |
| 2019/0005877 A1 | 1/2019 | Dong | |

FOREIGN PATENT DOCUMENTS

| | | |
|---|---|---|
| CN | 107038989 A | 8/2017 |
| CN | 107919091 A | 4/2018 |

\* cited by examiner

OLED DISPLAY PANEL HAVING RESET SIGNAL LINES TO RESET PIXEL UNITS AND DISPLAY DEVICE WITH THE SAME

CROSS-REFERENCE TO RELATED APPLICATIONS

This is a continuation of International Application PCT/CN2018/092072, with an international filing date of Jun. 21, 2018, which claims foreign priority of Chinese Patent Application No. 201810359636.3, filed on Apr. 20, 2018 in the State Intellectual Property Office of China, the contents of all of which are hereby incorporated by reference.

TECHNICAL FIELD

The embodiments of the present disclosure relate to the technical field of OLED display, and particularly to an OLED display panel and a display device.

BACKGROUND

OLED, which has many advantages such as broad color gamut, high contrast, energy conservation and foldability, has strong competitiveness in new-generation displays. Parameters that characterize quality of an OLED display panel are numerous, such as color gamut, power consumption, uniformity, etc.

It is publicly known that, when current flows in a conductor, a voltage drop will occur due to the effect of resistance in the conductor; and when a display panel is powered for its operation, upper and lower portions of the display panel are supplied with different magnitudes of voltages, thereby leading to display non-uniformity of the display panel, i.e., so-called IR drop, which will greatly deteriorate the display effect of the display panel.

SUMMARY

The technical problem mainly solved by the present disclosure is to provide an OLED display panel and an OLED display screen, capable of improving display uniformity of the OLED display panel.

To solve the above technical problem, embodiments of the present disclosure provide an OLED display panel, comprising: an array substrate, a reset signal line and a power signal line. The reset signal line and the power signal line are respectively connected to pixel units of the array substrate. Therein, the power signal line is used to transmit a power voltage to the pixel units of the array substrate such that the pixel units can operate; and the reset signal line is used to transmit reset voltage to the pixel units of the array substrate to reset the pixel units.

Therein, the reset signal line includes a connection line connected to the pixel units of the array substrate, and a current direction in the power signal line is the same as that in the connection line.

The embodiments of the present disclosure further provide an OLED display screen, including the OLED display panel provided by the embodiments of the present disclosure.

As compared with the prior art, the present disclosure has the following advantageous effects: the connection line of the reset signal line is connected to the pixel units of the array substrate; the current direction in the power signal line is the same as that in the connection line; luminance of the display panel gets increasingly lower along the current direction in the power signal line, and reset voltage of the connected pixel units gets increasingly lower along the current direction in the connection line of the reset signal line; according to Equation $I=k(V_g-V_s-V_{th})^2$ of OLED light-emitting current, the lower the reset voltage, the lower the $V_g$; due to $V_g<V_s$, the smaller the $V_g$, the larger the light-emitting current of OLED, then the greater the luminance. By configuring a current direction in the power signal line to be the same as that in the connection line, luminance non-uniformity occurring in the power signal line is made to neutralize and partially counteract luminance non-uniformity occurring in the connection line, thereby effectively reducing luminance non-uniformity of the display panel.

DETAILED DESCRIPTION

A clear and complete description of the technical solutions in the embodiments of the present disclosure will be given below in conjunction with the accompanying drawings in the embodiments of the present disclosure. Apparently, the embodiments described below are merely a part of the embodiments of the present disclosure, rather than all of the embodiments. All other embodiments obtained by a person of ordinary skill in the art without creative efforts on the basis of the embodiments of the present disclosure shall fall within the protection scope of the present disclosure.

Figure 1:
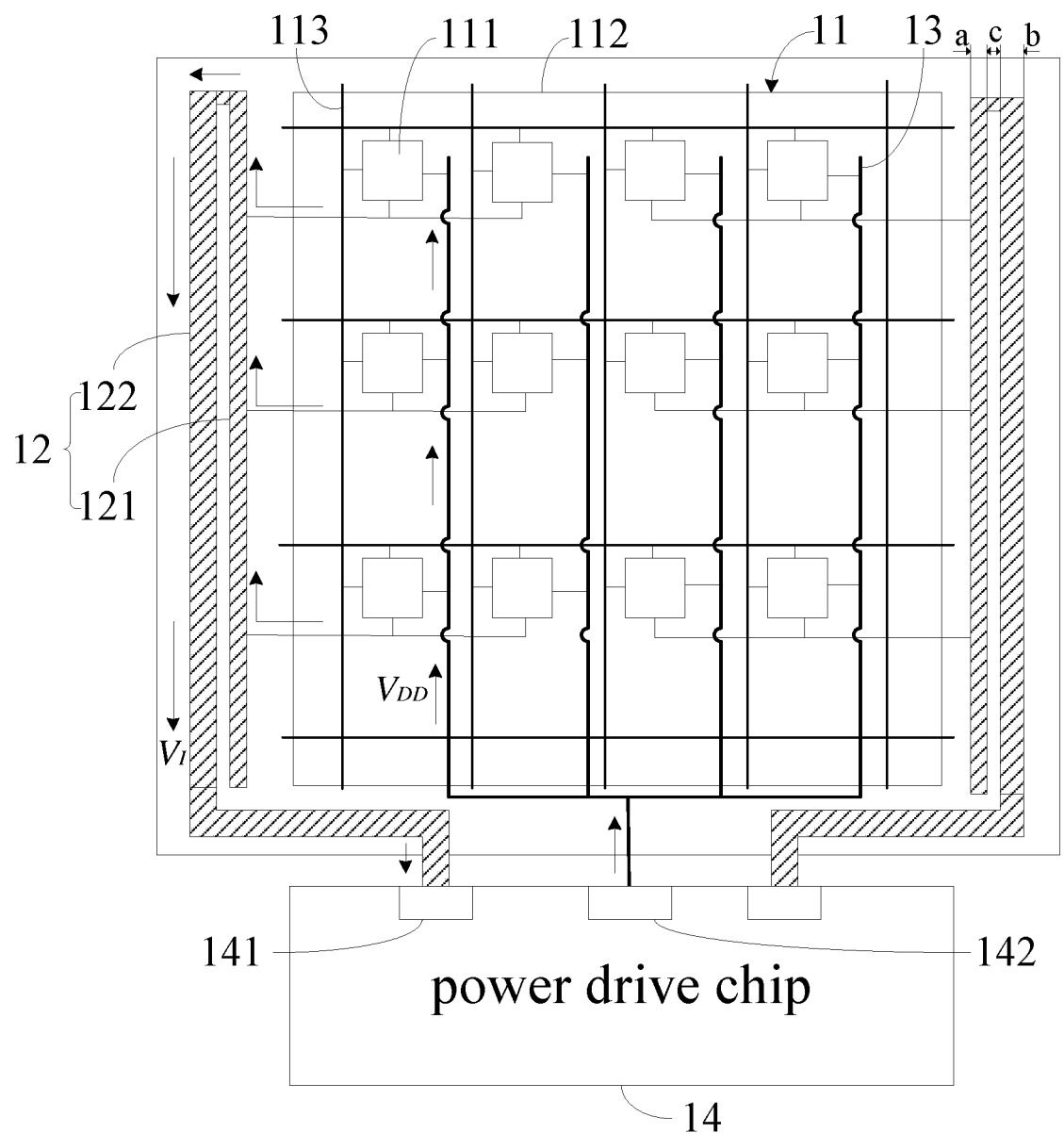
FIG. 1 is a structural diagram showing an embodiment of an OLED display panel according to the present disclosure.

Referring to FIG. 1, an OLED display panel according to an embodiment of the present disclosure may include an array substrate 11, a reset signal line 12, and a power signal line 13. The reset signal line 12 and the power signal line 13 may be respectively connected to pixel units 111 of the array substrate 11. For example, the reset signal line 12 and the power signal line 13 are configured in a same direction, that is, extend in a same direction to connect the pixel units 111. Therein, the power signal line 13 may be used to transmit a power voltage $V_{DD}$ to the pixel units 111 of the array substrate 11 such that the pixel units 111 can operate. For example, the power voltage $V_{DD}$ transmitted by the power signal line 13 may be used for illuminating OLED such that it can emit light. The reset signal line 12 may be used to transmit a reset voltage $V_I$ to the pixel units 111 of the array substrate 11 to reset data voltage of the pixel units 111. In the present embodiment, before data signal or data voltage may be rewritten into the pixel units 111 of the array substrate 11, there may be a need to reset data voltage already present in the pixel units 111, and the reset voltage $V_I$ may be transmitted via the reset signal line 12. That is, there may be a need to reset the previously written data voltage of the pixel units 111, to facilitate subsequent rewriting. Otherwise, the display panel would not display or would not adjust the gray scale, color, and the like.

In the present embodiment, the so-called reset voltage $V_I$ may be considered as a reset signal, for example, a low level signal may be applied to the pixel units 111 via the reset signal line 12, so that the data voltage of the pixel units 111 may be greater than potential at each location of the reset signal line 12 and thereby current of the pixel units 111 flows towards the reset signal line 12. That is, the data voltage of the pixel units 111 may be lowered to the level of the reset voltage $V_I$ to reset the pixel units 111, thus facilitating next rewriting of a data voltage or data signal. In the present embodiment, the reset signal line 12 may be configured to reset the data voltage of the pixel units 111. Data signal of the array substrate 11 may be generally transmitted by a column electrode line 113. Therefore, when a connection line 121 of the reset signal line 12 may be connected to the pixel units 111 along a direction of the column, the power signal line 13 may also be connected to the pixel units 111 along the direction of the column.

Therein, the reset signal line 12 may include a connection line 121 connected to the pixel units 111 of the array substrate 11. A current direction in the power signal line 13 may be the same as that in the connection line 121.

In the present embodiment, a voltage drop (IR Drop) exists in the power signal line 13 due to the conductor. In the process of transmitting current, display non-uniformity will occur to display luminance of the display panel along with the voltage drop. Luminance at a location where the power voltage $V_{DD}$ is high may be higher, whereas luminance at a location where the power voltage $V_{DD}$ is low may be lower. In general, the reset signal line 12 may be connected to a gate of a driving transistor (for example, a second transistor T2 in FIG. 3) of the pixel units 111. The data voltage may be also written to the gate of the driving transistor. The voltage drop present in the reset signal line 12 also may affect starting potential of the gate of the driving transistor, thereby resulting in differences in the voltages of the gates of different pixel units 111 in the process of writing the data voltage; and the starting potential of the driving transistor may get increasingly lower along the current direction of the reset signal line 12. According to Equation $I=k(V_g-V_s-V_{th})^2$ of OLED light-emitting current, $V_g<V_s$, and thus, the smaller the $V_g$, the larger the light-emitting current of the OLED. Accordingly, along the current direction of the connection line 121 of the reset signal line 12, $V_g$ may get increasingly lower, whereas luminance gets increasingly greater, which may be just opposite to luminance-darkness non-uniformity resulting from the voltage drop of the power signal line 13.

In the present embodiment, the connection line 121 of the reset signal line 12 may be connected to units of the array substrate 11, and the current direction in the power signal line 13 may be the same as that in the connection line 121. That is, luminance of the display panel may get increasingly lower along the current direction in the power signal line 13; and the reset voltage $V_I$ of the connected pixel units 111 may get increasingly lower along the current direction in the connection line 121 of the reset signal line 12, but the luminance may get increasingly higher. According to the present embodiment, by configuring the current direction in the power signal line 13 to be the same as that in the connection line 121, luminance non-uniformity occurring in the power signal line 13 may be made to neutralize and partially counteract luminance non-uniformity occurring in the connection line 121, thereby effectively reducing luminance non-uniformity of the OLED display panel.

With further reference to FIG. 1, optionally, the reset signal line 12 may further include an extension line 122. The connection line 121 may extend in a direction from an end of the array substrate 11 to the other end and may be connected to the pixel units 111 of the array substrate 11. The connection line 121 may be connected to an end of the extension line 122 at a position adjacent to the other end of the array substrate 11. The other end of the extension line 122 may be used to input a reset voltage $V_I$ such as a low level signal. Therein, the current in the reset signal line 12 may first flow through the connection line 121 in the direction from an end of the array substrate 11 to the other end of the array substrate 11, and then flow through the extension line 122 in the direction from the other end of the array substrate 11 to the end of the array substrate 11. The current in the power signal line 13 may flow from an end of the array substrate 11 to the other end of the array substrate 11.

In the present embodiment, for example, the array substrate 11 may include a plurality of pixel units 111. The connection line 121 may extend from an end of the array substrate 11 to the other end (e.g., in a column direction) and connect the plurality of pixel units 111. The connection line 121 may be connected to an end of the extension line 122 at a position adjacent to the other end of the array substrate 11. The other end of the extension line 122 may be used to input a reset voltage $V_I$. The pattern formed by the connection line 121 and the extension line 122 may be an n-shape for example, and the top of the n-shape may be a joint.

Specifically, the current in the power signal line 13 may flow from an end of the array substrate 11 to the other end of the array substrate 11, that may be, power may be supplied from an end of the array substrate 11 to the other end of the array substrate 11. The power voltage $V_{DD}$ of the pixel units 111 to which the power signal line 13 is connected may gradually become lower due to the effect of voltage drop. Thus, luminance from an end of the array substrate 11 to the other end gradually may decrease. Where these pixel units 111 may be affected by the reset voltage $V_I$ of the reset signal line 12 of the connection line 121, the gate voltage of the driving transistor of the pixel units 111 of the array substrate 11 from an end toward the other end may be reduced, so the other end of the array substrate 11 may have great luminance while the end of the array substrate 11 may have low luminance, which neutralizes the luminance effect produced by the power signal line 13, thereby making it possible to effectively reduce the display non-uniformity of the display panel.

With further reference to FIG. 1, optionally, a width a of the connection line 121 may be smaller than or equal to a width b of the extension line 122. For example, when the connection line 121 and the extension line 122 do not greatly differ in line thickness and length, the width a of the connection line 121 may be smaller than or equal to the width b of the extension line 122, so that a cross-sectional area of the connection line 121 may be greater than or equal to a cross-sectional area of the extension line 122. According to $$R = \frac{\rho L}{S},$$

resistance of the connection line 121 may be greater than or equal to that of the extension line 122, so there will be a greater voltage drop effect on the connection line 121. As such, it is possible to more effectively partially neutralize or alleviate the effect of display non-uniformity resulting from the voltage drop of the power signal line 13, to further achieve more uniform display of the display panel.

With further reference to FIG. 1, optionally, a width c of the joint of the connection line 121 and the extension line 122 may be smaller than the width a of the connection line 121 and the width b of the extension line 122. By setting the width c of the joint to be smaller than the width a of the connection line 121 and the width b of the extension line 122, it is, on one hand, possible to reduce space occupied by the reset signal line 12 to simplify circuit arrangement; and on the other hand, it is advantageous for transmission of the reset signal and loss reduction.

Of course, in other embodiments, the width c of the joint can be smaller than one of the width of the connection line 121 and the width of the extension line 122, or greater than one or both of them.

With further reference to FIG. 1, optionally, the display panel may further include a power drive chip 14. The power drive chip 14 may include at least a reset voltage interface 141 and a power voltage interface 142. The reset voltage interface 141 may be connected to the extension line 122 to transmit the reset voltage $V_I$ to the pixel units 111 of the array substrate 11 via the reset signal line 12. The power voltage interface 142 may be connected to the power signal line 13 to supply the power voltage $V_{DD}$ to the pixel units 111 via the power signal line 13.

For example, the power drive chip 14 may be disposed at an end of the array substrate 11, and the power voltage interface 142 may be connected to the power signal line 13. Therefore, current in the power signal line 13 may flow from an end of the array substrate 11 to the other end of the array substrate 11, and the reset voltage interface 141 may provide a low level signal to the pixel units 111 via the reset signal line 12, so current in the reset signal line 12 may flow in a direction from the pixel units 111 to the reset voltage interface 141. That is, the current flows through the connection line 121 in a direction from the end of the array substrate 11 to the other end of the array substrate 11 and then flows through the extension line 122 in a direction from the other end of the array substrate 11 to the end of the array substrate 11, to reach the reset voltage interface 141. Accordingly, the current direction of the connection line 121 may be the same as the current direction of the power signal line 13, so that luminance display uniformity of the display panel can be improved.

Figure 2:
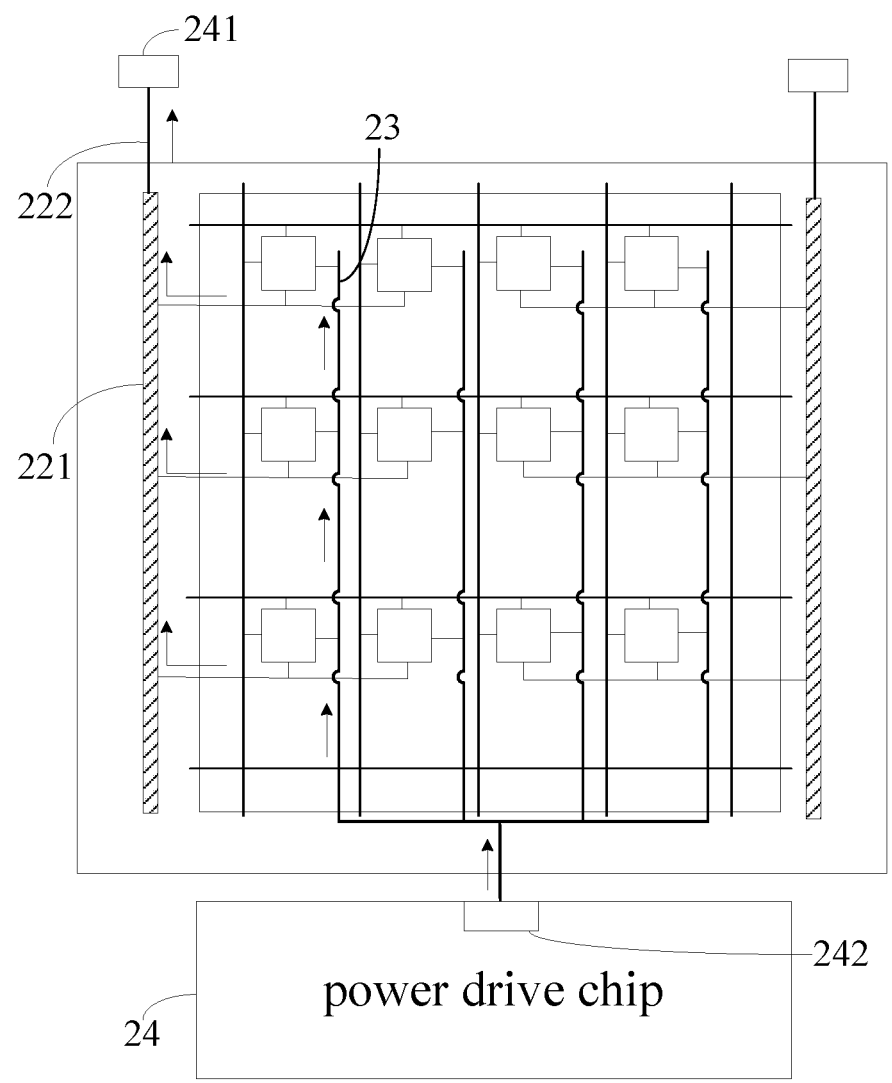
FIG. 2 is a structural diagram showing another embodiment of the OLED display panel according to the present disclosure.

Referring to FIG. 1 and FIG. 2, in other embodiments, the display panel may further include a power drive chip 24. The reset voltage interface 241 may be disposed at the other end of the array substrate 21. The extension line 222 may be connected between the connection line 221 and the reset voltage interface 241. Thereby, current may directly flow through the connection line 221 and the extension line 222 in the direction from an end of the array substrate 21 to the other end thereof. The above other embodiments mainly differ from the embodiment of the OLED display panel in the present disclosure in that: the reset voltage interface 141 and the reset voltage interface 241 may be disposed at different positions, but the current directions in the connection line 121 and the connection line 221 may be the same and the current direction in the power signal line 23 may be also the same. For example, the reset voltage interface 241 and the power voltage interface 242 may not be disposed simultaneously on a same power drive chip 24.

Figure 3:
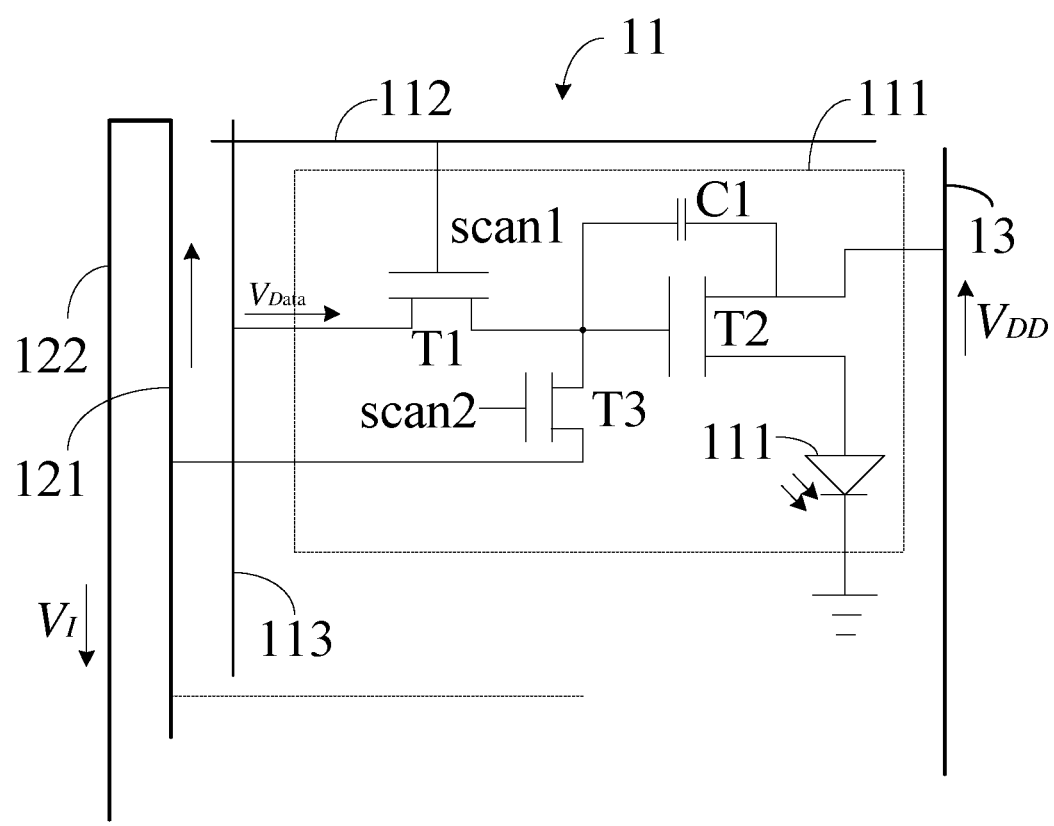
FIG. 3 is a diagram showing a circuit structure of pixel units in an embodiment of the OLED display panel according to the present disclosure.

Referring to FIG. 1 and FIG. 3, optionally, the array substrate 11 may further include a plurality of row electrode lines 112, a plurality of column electrode lines 113, and a plurality of pixel units 111. Each pixel unit 111 may be correspondingly connected to one of the row electrode lines 112 and one of the column electrode lines 113. Each pixel unit 111 may include a first transistor T1, a second transistor T2, and a light-emitting unit 1111. The gate of the first transistor T1 may be connected to the row electrode line 112, and the drain of the first transistor T1 may be connected to the column electrode line 113. The source of the first transistor T1 may be connected to a gate of the second transistor T2. The source of the second transistor T2 may be connected to the power voltage interface 142 via the power signal line 13. The drain of the second transistor T2 may be grounded. The light-emitting unit 1111 may be connected to the source or drain of the second transistor T2. Therein, the connection line 121 may be connected to the gate of the second transistor T2 to transmit the reset voltage $V_I$ to the pixel units 111 before the data voltage $V_{Data}$ is written into the pixel units 111.

Referring to FIG. 3, the plurality of row electrode lines 112 may be used to transmit a scan signal scan1 to the array substrate 11, to gate the scanned pixel units 111; and the plurality of column electrode lines 113 may be used to input data signals to the gated pixel units 111, that may be, data voltage may be written into the pixel units 111. When the row electrode lines 112 input the high-level scan signal scan1, the gate of the first transistor T1 may be turned on, i.e., the drain and the source of the first transistor T1 may be on. In this case, the data voltage of the column electrode lines 113 may be input to the gate of the second transistor T2, and the gate of the second transistor T2 may be on. The light-emitting unit 1111 (OLED light emitting unit), powered by the power voltage $V_{DD}$, emits light.

During scanning of the row electrode lines 112 and before the row electrode lines 112 gate the pixel units 111 in the row, there may be a need to reset the gate voltage of the second transistor T2 via the reset signal line 12 before writing data voltage into the gate of the second transistor T2, such that the data voltage can be normally written into the gate of the second transistor T2, causing the light emitting unit 1111 to emit light normally.

In the present embodiment, that the light emitting unit 1111 may be connected to the source or the drain of the second transistor T2 means that an end of the light emitting unit 1111 may be connected to the source of the second transistor T2, and the other end may be connected to the power signal line 13, or means that an end of the light emitting unit 1111 may be connected to the drain of the second transistor T2 and the other end may be grounded.

In order to further describe the technical solution of the present disclosure, Equation may be used hereinafter in conjunction with FIG. 1 and FIG. 3. According to Equation $I=k(V_g-V_s-V_{th})^2$ of OLED light-emitting current, wherein $k=\mu CoxW/2L$, Cox is capacitance of the insulated gate per unit area, $\mu$ is saturation mobility of the thin film transistor, and W/L is a channel width-length ratio of the thin film transistor, i.e., k per se is related to the property of the thin film transistor (second transistor T2). $V_g$ is the gate voltage of the second transistor T2, $V_s$ is the source voltage of the second transistor T2, and $V_{th}$ is the threshold voltage of the second transistor T2. In the present embodiment, $V_g$ is mainly provided by the data voltage $V_{Data}$ supplied from the column electrode lines 113, but the reset voltage $V_I$ may affect starting voltage of the second transistor T2, and $V_s$ is provided by the power voltage $V_{DD}$. In general, $V_g<V_s$, so the smaller the $V_g$, the larger the OLED's light-emitting current, and the brighter the OLED. In other words, there may be different reset voltages $V_I$ between different pixel units 111; in the process of writing data voltage, $V_g$ of the second transistor T2 may be also different; and the lower the reset voltage $V_I$, the lower the $V_g$ of the second transistor T2, and thus the larger the OLED light-emitting current.

For example, after the connection line 121 may transmit a low level, the pixel units 111 connected to the connection line 121, viewed from the direction from an end of the array substrate 11 to the other end, may have reset voltages of −1V, −2V, −3V, respectively, due to the influence of the voltage drop; and data voltage $V_{Data}$ of 5V will be written into these pixel units 111. Thus, at the same writing speed 1V/S and within 1S, for example, the gate voltages $V_g$ of the pixel units 111 may be 4V, 3V and 2V, respectively. If time is sufficient, $V_g$ # $V_{Data}$ in the writing process, but the pixel units 111 lastly still involve $V_g=V_{Data}$, also each 5V. However, when scanning time of the row electrode lines 112 is short, for example, only 1S, none of the gate voltages $V_g$ of the pixel units 111 will be equal to 5V, and the gate voltages $V_g$ of the pixel units 111 will be 4V, 3V, 2V, respectively. Alternatively, before the gate voltage $V_g$ of the pixel units 111 may be equal to $V_{Data}$, the gate voltages $V_g$ of the respective pixel units 111 may be different, and may gradually decrease along the current direction. According to Equation $I=k(V_g-V_s-V_{th})^2$, the lower the $V_g$, the greater the OLED light-emitting current, i.e., the light emission luminance at an end of the array substrate 11 may be low, whereas the light emission luminance at the other end may be high, which is just opposite to the display effect generated by the voltage drop of the power signal line 13 on the display panel.

Therefore, the current in the connection line 121 may flow from an end of the array substrate 11 to the other end, i.e., $V_g$ may gradually become smaller, and the OLED light-emitting luminance may gradually increase. The current in the connection line 121 may flow in the same direction as the current in the power signal line 13, thereby making it possible to reduce the display panel's display non-uniformity resulting from the voltage drop of the power signal line 13.

Further, the display panel may further include a third transistor T3. The reset signal line 12 may be connected to the gate of the second transistor T2 via the third transistor T3. Specifically, a gate of the third transistor T3 may be used to input a gating signal scan2. The drain of the transistor T3 may be connected to the reset signal line 12, and a source of the third transistor T3 may be connected to a source of the second transistor T2.

To be specific, when the row electrode lines 112 do not gate a part of the pixel units 111, the gate of the third transistor T3 may receive the gating signal scan2; the source and drain of the third transistor T3 may be on; and the reset signal line 12, in conduction with the gate of the second transistor T2, may transmit a low level signal to reset the gate of the second transistor T2.

Optionally, the pixel units 111 may further include a storage capacitor C1 connected between the source of the first transistor T1 and the source of the second transistor T2.

Optionally, the display panel may further include a row driver and a column driver (not shown). The row driver may be used to transmit the scan signal scan1 to scan and select the row electrode lines 112 of the array substrate 11, and the column driver may be used to input a data voltage $V_{Data}$ to the pixel units 111 corresponding to the selected row electrode lines 112 via the column electrode lines 113.

With further reference to FIG. 1, optionally, the display panel may include at least two reset signal lines 12, which may be disposed on two sides of the array substrate 11 and may be respectively connected to different pixel units 111. By providing at least two reset signal lines 12 on the two sides at the same time, it is possible to improve reset efficiency of the pixel units 111 and reduce the delay, thereby facilitating improving uniformity of the display panel.

Figure 4:
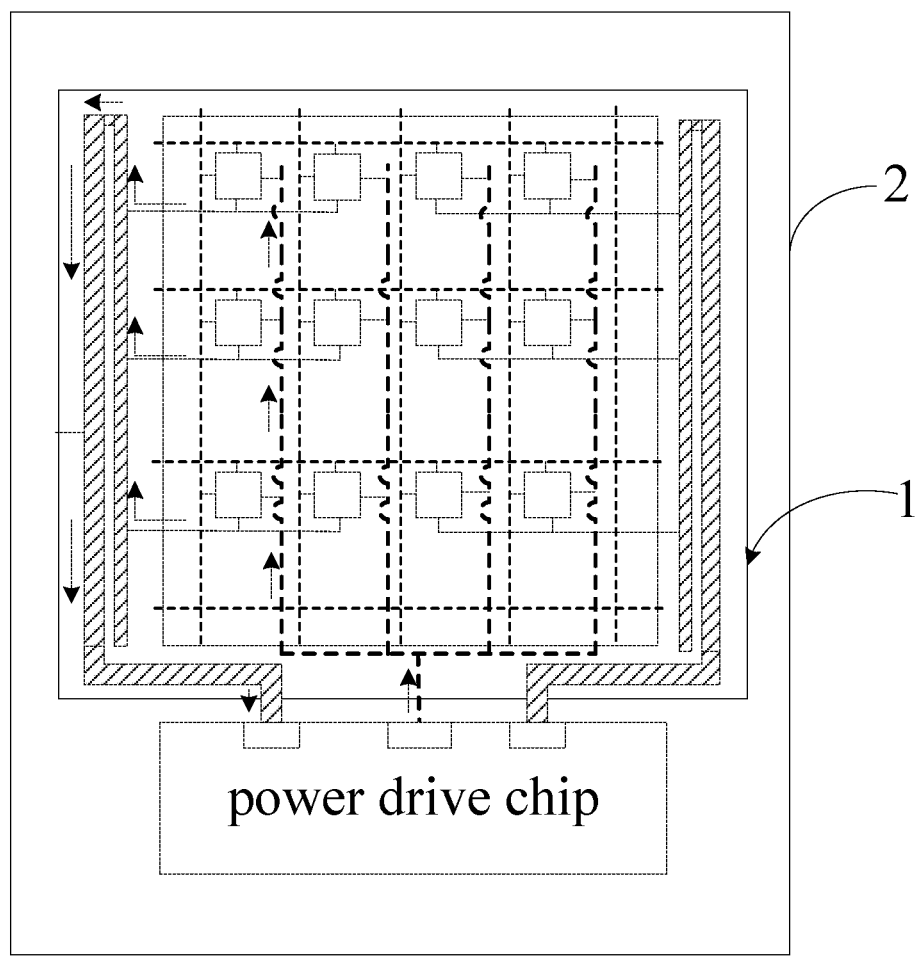
FIG. 4 is a structural diagram showing an embodiment of a display device according to the present disclosure.

Referring to FIG. 4, a display device according to an embodiment of the present disclosure may include the OLED display panel described in the embodiment of the OLED display panel of the present disclosure. The display device may be considered as a display screen, such as an OLED display screen. The display device may also be considered as a device including a display screen, such as a mobile phone, a panel PC, a notebook PC, a television, etc., wherein the display screen includes the display panel.

To sum up, in the embodiments of the OLED display panel and the display device of the present disclosure, the connection line 121 of the reset signal line 12 may be connected to the pixel units 111 of the array substrate 11, and the current direction in the power signal line 13 may be the same as that in the connection line 121. As such, the luminance of the display panel may get increasingly lower along the current direction in the power signal line 13, and the reset voltage $V_I$ of the connected pixel units 111 may get increasingly lower along the current direction in the connection line 121 of the reset signal line 12, but the luminance may get increasingly higher. According to the present embodiment, by configuring the current direction in the power signal line 13 to be the same as that in the connection line 121, luminance non-uniformity occurring in the power signal line 13 may be made to neutralize and partially counteract luminance non-uniformity occurring in the connection line 121, thereby effectively reducing luminance non-uniformity of the OLED display panel.

The foregoing are only the implementing modes of the present disclosure, which are not intended to limit the scope of the present disclosure. Any equivalent structure or equivalent process transformation made by using the contents of the description and the accompanying drawings of the present disclosure, or directly or indirectly applied in other related technical fields, is similarly included in the protection scope of the present disclosure.

What is claimed is:
1. An OLED display panel, comprising:
an array substrate;
a reset signal line and a power signal line respectively connected to pixel units of the array substrate, wherein the power signal line is configured to transmit a power voltage to the pixel units such that the pixel units operate, and the reset signal line is configured to transmit a reset voltage to the pixel units to reset a data voltage of the pixel units; and
wherein the reset signal line comprises a connection line connected to the pixel units of the array substrate, a current direction in the power signal line being the same as that in the connection line;
wherein the reset signal line further comprises an extension line, the connection line extends in a direction from an end of the array substrate to another end and is connected to the pixel units of the array substrate, and the connection line is connected to an end of the extension line at a position adjacent to the other end of the array substrate, the other end of the extension line being configured to input the reset voltage; and wherein the current in the reset signal line first flows through the connection line in a direction from an end of the array substrate to the other end of the array substrate, and the current in the power signal line flows from an end of the array substrate to the other end of the array substrate.

2. The display panel according to claim 1, wherein the current in the reset signal line first flows through the connection line in the direction from an end of the array substrate to the other end of the array substrate, and then flows through the extension line in the direction from the other end of the array substrate to the end of the array substrate, the current direction in the extension line being opposite to that in the connection line.

3. The display panel according to claim 2, wherein a width of the connection line is smaller than or equal to a width of the extension line.

4. The display panel according to claim 3, a width of a joint of the connection line and the extension line is smaller than the width of the connection line.

5. The display panel according to claim 3, the width of the joint of the connection line and the extension line is smaller than the width of the extension line.

6. The display panel according to claim 1, wherein the current in the reset signal line first flows through the connection line in the direction from an end of the array substrate to the other end of the array substrate, and then flows through the extension line in the same direction, the current direction in the extension line being identical to that in the connection line.

7. The display panel according to claim 1, wherein the display panel further comprises a power drive chip comprising at least a reset voltage interface and a power voltage interface, the reset voltage interface being connected to the extension line to transmit the reset voltage to the pixel units of the array substrate via the reset signal line, and the power voltage interface being connected to the power signal line to supply the power voltage to the pixel units via the power signal line.

8. The display panel according to claim 7, wherein the array substrate further comprises a plurality of row electrode lines, a plurality of column electrode lines, and a plurality of the pixel units, wherein each of the pixel units, correspondingly connected to one of the row electrode lines and one of the column electrode lines, comprises a first transistor, a second transistor, and a light-emitting unit, a gate of the first transistor being connected to the row electrode line, a drain of the first transistor being connected to the column electrode line, a source of the first transistor being connected to a gate of the second transistor, the source of the second transistor being connected to the power voltage interface via the power signal line, the drain of the second transistor being grounded, the light-emitting unit being connected to the source or drain of the second transistor, and wherein the connection line is connected to the gate of the second transistor to transmit the reset voltage to the pixel units before the data voltage is written into the pixel units.

9. The display panel according to claim 8, wherein the pixel units further comprise a storage capacitor connected between the source of the first transistor and the source of the second transistor.

10. The display panel according to claim 8, wherein the display panel further comprises a third transistor, a gate of the third transistor being configured to input a gating signal, a drain of the third transistor being connected to the reset signal line, and a source of the third transistor being connected to the source of the second transistor.

11. The display panel according to claim 8, wherein the display panel further comprises a row driver for transmitting a scan signal to scan and select the row electrode lines of the array substrate, and a column driver for inputting the data voltage to the pixel units corresponding to the selected row electrode lines via the column electrode lines.

12. The display panel according to claim 1, wherein the display panel comprises at least two reset signal lines disposed on two sides of the array substrate and respectively connected to different pixel units.

13. A display device, comprising a display panel, wherein the display panel comprises:
an array substrate;
a reset signal line and a power signal line respectively connected to pixel units of the array substrate, wherein the power signal line is configured to transmit a power voltage to the pixel units such that the pixel units operate, and the reset signal line is configured to transmit a reset voltage to the pixel units to reset data voltage of the pixel units; and
wherein the reset signal line comprises a connection line connected to the pixel units of the array substrate, a current direction in the power signal line being the same as that in the connection line;
wherein the reset signal line further comprises an extension line, the connection line extends in a direction from an end of the array substrate to another end and is connected to the pixel units of the array substrate, and the connection line is connected to an end of the extension line at a position adjacent to the other end of the array substrate, the other end of the extension line being configured to input the reset voltage, and wherein the current in the reset signal line first flows through the connection line in a direction from an end of the array substrate to the other end of the array substrate, and the current in the power signal line flows from an end of the array substrate to the other end of the array substrate.

14. The display device according to claim 13, wherein the current in the reset signal line first flows through the connection line in the direction from an end of the array substrate to the other end of the array substrate, and then flows through the extension line in the direction from the other end of the array substrate to the end of the array substrate, the current direction in the extension line being opposite to that in the connection line.

15. The display device according to claim 13, wherein the current in the reset signal line first flows through the connection line in the direction from an end of the array substrate to the other end of the array substrate, and then flows through the extension line in the same direction, the current direction in the extension line being identical to that in the connection line.

16. The display device according to claim 13, wherein the display panel further comprises a power drive chip comprising at least a reset voltage interface and a power voltage interface, the reset voltage interface being connected to the extension line to transmit the reset voltage to the pixel units of the array substrate via the reset signal line, and the power voltage interface being connected to the power signal line to supply the power voltage to the pixel units via the power signal line.

17. The display device according to claim 16, wherein the array substrate further comprises a plurality of row electrode lines, a plurality of column electrode lines, and a plurality of the pixel units, wherein each of the pixel units, correspondingly connected to one of the row electrode lines and one of the column electrode lines, comprises a first transistor, a second transistor, and a light-emitting unit, a gate of the first transistor being connected to the row electrode line, a drain of the first transistor being connected to the column electrode line, the source of the first transistor being connected to a gate of the second transistor, the source of the second transistor being connected to the power voltage interface via the power signal line, the drain of the second transistor being grounded, the light-emitting unit being connected to the source or drain of the second transistor, and wherein the connection line is connected to the gate of the second transistor to transmit the reset voltage to the pixel units before the data voltage is written into the pixel units.

* * * * *